United States Patent [19]

Goth

[11] Patent Number: 4,717,678
[45] Date of Patent: Jan. 5, 1988

[54] METHOD OF FORMING SELF-ALIGNED P CONTACT

[75] Inventor: George R. Goth, Poughkeepsie, N.Y.

[73] Assignee: International Business Machines Corporation, Armonk, N.Y.

[21] Appl. No.: 837,125

[22] Filed: Mar. 7, 1986

[51] Int. Cl.⁴ .................. H01L 21/265; H01L 21/40
[52] U.S. Cl. ........................................ 437/27; 437/30; 437/31; 437/51; 437/188; 437/931
[58] Field of Search ................. 29/576 B, 578, 590, 29/571; 148/1.5, DIG. 83, DIG. 9.6; 357/34, 65

[56] References Cited

U.S. PATENT DOCUMENTS

| | | | |
|---|---|---|---|
| 3,212,162 | 3/1965 | Moore | 29/578 |
| 3,540,950 | 1/1967 | Harlow | 29/578 |
| 4,014,718 | 3/1977 | Tomozawa et al. | 148/187 |
| 4,032,957 | 6/1977 | Yagi et al. | 357/37 |
| 4,110,125 | 8/1978 | Beyer | 148/1.5 |
| 4,125,426 | 11/1978 | Inayoshi et al. | 148/1.5 |
| 4,233,337 | 11/1980 | Friedman | 148/1.5 |
| 4,325,180 | 4/1982 | Curran | 29/571 |
| 4,377,029 | 3/1983 | Ozawa | 148/1.5 |
| 4,385,433 | 5/1983 | Ozawa | 148/1.5 |
| 4,475,280 | 10/1984 | Ragonese et al. | 29/578 |

OTHER PUBLICATIONS

Fairene, "The Oxidation of Heavily B–and P–Doped single crystal Silicom", J. Electrochem. Soc., 125, 1978, pp. 1146–1151.

Glazor/Subalc-Sharpe, "Integrated Circuit Engineering" Addison-Wesley; 1977, pp. 256–259.

Ghandhi, "VLSI Fabrication Principles," John Wiley & Sons, N.Y., pp. 383–384, 392–394.

Primary Examiner—Brian E. Hearn
Assistant Examiner—T. Thomas
Attorney, Agent, or Firm—T. Rao Coca

[57] ABSTRACT

Disclosed is a process for forming self-aligned low resistance ohmic contact to a P doped region (e.g., base of an NPN device) in conjunction with forming similar contact to a (highly) N doped region (e.g., emitter of NPN). After forming a P doped region in an N type monocrystalline silicon body and masking it with an insulator (e.g. dual oxide-nitride) layer, the highly doped N region (hereafter, N+ region) is formed in a portion of the P doped region by selectively opening the insulator layer and introducing N dopant therethrough. This opening also serves as contact opening for the N+ region. contact opening for the P region is formed by selectively etching the insulator layer. The structure is subjected to a low temperature steam oxidation to from an oxide layers in the P contact and N+ contact regions, the oxide in the N+ contact being about 3–5 times thicker than that in the P contact region due to the significantly higher oxidation rate of the N+ region relative to the P doped region. The oxide in the P contact is etched off while retaining a substantial portion of the oxide grown in the N+ contact region. P type dopant is then introduced into the P contact opening to achieve solid solubility limit of the P dopant species in silicon. The oxide remaining in the N+ contact region is removed and contact metallurgy is established with all contacts.

20 Claims, 8 Drawing Figures

METHOD OF FORMING SELF-ALIGNED P CONTACT

BACKGROUND OF THE INVENTION

This invention relates to a process for forming high performance integrated circuit devices, and more particularly, to a process for forming self-aligned and low resistance contacts to P type regions in a semiconductor substrate constituting the integrated circuit.

As used herein, a P type region includes the following: In the case of a single vertical NPN transistor formed in a semiconductor body, it designates the base of the transistor; in the case of a complementary vertical NPN device and lateral PNP (hereafter, LPNP) transistor, P type region includes the base of the NPN, collector or emitter of LPNP and resistors (if resistors are integrated into the complementary circuit); and in the case of complementary field effect transistors (FET), the P type region is the source or drain of the PFET.

Focussing for discussion purposes on the fabrication of a single vertical NPN transistor, briefly, referring to FIG. 1, the conventional method of forming the device consists of forming an N+ subcollector 12 on a P− silicon substrate 10. An N type epitaxial silicon layer 14 is then formed followed by introducing P type (e.g., boron) dopant into a selected region of layer 14 to a peak concentration of about $(1-5) \times 10^{18}$ atoms/cc to form the transistor base 16. The structure is then thermally oxidized to form a silicon dioxide 18. Silicon nitride 20 is additionally formed over the entire structure. An opening is then made in the oxide and nitride layers overlying a portion of the base diffusion 16 and N type dopant (e.g., arsenic) is introduced into the exposed base region to form the emitter 22. Finally, contact opening is made in the oxide-nitride insulator over the base and conductive metallurgical contacts 24 and 26 are established with the base and emitter regions, respectively. Suitable device isolation (such as recessed isolation or trench isolation) is also formed during the course of the device fabrication. U.S. Pat. Nos. 4,014,718 issued to Tomozawa et al and 4,032,957 issued to Yagi et al are illustrative of this prior art practice.

Referring to the structure shown in FIG. 1, the NPN transistor is characterized by a base series resistance Rb which consists of roughly three components: (1) the intrinsic base resistance Rbi which designates the resistance of the base portion lying directly beneath the emitter 22; (2) the extrinsic base resistance Rbe which is the resistance of the base portion which resides between the edge of the emitter/base junction 28 and the edge of the contact 24; and the base contact resistance Rbc which is the resistance incurred due to making metallurgical contact to the base surface region. To a first approximation, the mathematical relationship between Rb and its components may be expressed as $$Rb = Rbc + Rbe + Rbi$$

With ever-increasing demands placed on circuit performance (speed of operation) particularly in the case of bipolar logic applications such as current switch, emitter-follower or bipolar array circuits, it is imperative that Rb be rendered as low as possible. Also, as the operation current levels in these circuits increase the impact of Rb on the circuit performance increases proportionally.

A basic deficiency of the prior art bipolar device fabrication discussed hereinabove is that during the thermal oxidation step to form the oxide layer 18, the P type (boron) dopant, due to its high segregation coefficient, rapidly segregates into the oxide layer 18. This, in turn, depletes the surface concentration of P dopant in the base surface resulting in a significant increase in the contact resistance component Rbc of the base series resistance Rb after the contact metallurgy 24 is formed.

As microelectronics industry evolves into the very large scale integration (VLSI) and ultra large scale integration (ULSI) eras by shrinking the device sizes, the resistance components Rbi and Rbe correspondingly decrease (assuming that the base and emitter regions are doped to optimal concentration levels). However, since the size of the device contacts cannot be reduced indefinitely, in this situation the resistance associated with the metal-silicon interface, Rbc, becomes, by far, the dominant component. Thus, it is imperative that Rbc be reduced consistent with the requirements of VLSI and ULSI circuit applications.

It would appear that one method of reducing Rbc is to dope the base region at the outset to an excessively high concentration level (e.g., solid solubility limit of boron in silicon). However, during the various subsequent thermal steps, the dopant will be pushed excessively deep increasing the base-collector capacitance which renders the device slow. Another disadvantage of such excessive blanket doping of the base region is creation of a leaky emitter-base junction 28.

An alternative method of reducing Rbc would appear to be utilization of a blockout mask to selectively introduce additional dopant into the base contact region following the emitter fabrication to compensate for the segregated dopant therein. However, this requires not only an extra mask step which adds to the process complexity, but also may result in higher Rbe due to an increase in the separation between the emitter and base contact brought about by two edge-to-edge tolerances corresponding to the opening in mask used to form the emitter and the opening in the extra mask under consideration. Also, this method will increase the total area of the base which leads to increased collector-base capacitance thereby further slowing the device. In this connection reference is made to U.S. Pat. No. 4,385,433 issued to Ozawa for its disclosure of P+ contact implant utilizing a photolithographic mask to avoid doping of N epitaxial regions (i.e., Schottky diode anodes).

Yet another method of reducing the base contact resistance is by utilization of a polysilicon base contact. Representative of this basic method is U.S. Pat. No. 4,125,426 issued to Inayoshi et al. In this process, typically, a polysilicon layer doped the solid solubility limit is formed over the entire base region immediately after the base fabrication to prevent segregation of P dopant from the base. The polysilicon is then patterned in a desired shape followed by making an opening in the polysilicon corresponding to the emitter region and embedding the emitter in a portion of the base region by introducing N type dopant therethrough. Thereafter, base contact opening is formed in the polysilicon and contact metallurgy is established with all elements of the transistor. This process, although lowering Rbc without increasing Rbe, requires two additional masks (one to open the region for the base and the second to define the polysilicon). Also, additional insulator layer formation and reactive ion etching (RIE) steps will be necessitated. This process also gives rise to undesirable device topology (consisting of deep valleys and high hills) since the polysilicon (to render its resistance low) is made sufficiently thick and subsequently coated with passivation layers. This topology is prone to introducing serious metallization problems.

The present invention overcomes these and other deficiencies of the prior art by means of a simple and straight forward process which guarantees low P contact resistance.

It is an object of the invention to selectively introduce P dopant into the P contact regions after completion of all thermal process steps to replenish the dopant loss therein during prior thermal process steps.

It is another object of the invention to achieve the aforementioned objective by taking advantage of the phenomenon that N+ doped regions oxidize at low temperatures at a preferentially high rate compared to P doped regions.

SUMMARY OF THE INVENTION

The above objects and other related objects and advantages may be achieved through the use of a novel process herein disclosed. In one preferred embodiment of this invention directed to the basic vertical NPN transistor fabrication, P dopant is selectively introduced into the base contact region after completion of all thermal process steps associated with the device fabrication. In this method, after forming the base region in an N type epitaxial layer and masking it with a dual oxide-nitride layer, the N+ emitter (concentration of typically about $3 \times 10^{20}$ atoms/cc) is formed in a portion of the base region by selectively opening the dual layer and introducing N type dopant therethrough into the exposed base. The structure may be annealed to achieve the desired depths and profiles for the various dopants in a conventional manner. Base contact opening is then formed by selectively etching the oxide-nitride layer. The structure is then subjected to a low temperature (example, 800°–900° C.) oxidation to form an oxide layer in the emitter contact opening which is 3–5 times thicker than that in the base contact opening due to a substantially higher oxidation rate of the N+ emitter contact region relative to the P base contact region. The thinner oxide in the base contact region is then etched off while substantially maintaining the thicker oxide in the emitter contact. P type dopant is then introduced in a self-aligned fashion into the base contact to achieve solid solubility limit of this dopant in the silicon base material. The remaining oxide in the emitter contact is removed and contact metallurgy is established with all contacts.

BRIEF DESCRIPTION OF THE DRAWINGS

The novel features, individual process steps and combination of these steps characteristic of the invention are set forth in the appended claims. The invention itself, however, will be best understood by reference to the detailed description which follows in conjunction with the accompanying drawings wherein:

DETAILED DESCRIPTION OF THE PREFERRED EMBODIMENT

Figure 6:
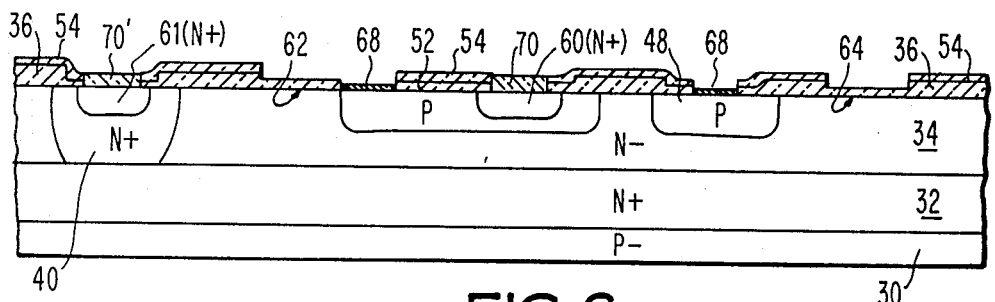
Figure 7:
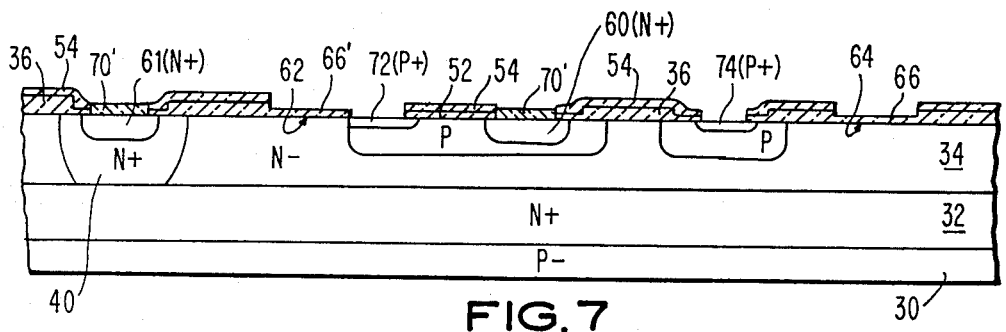
Figure 8:
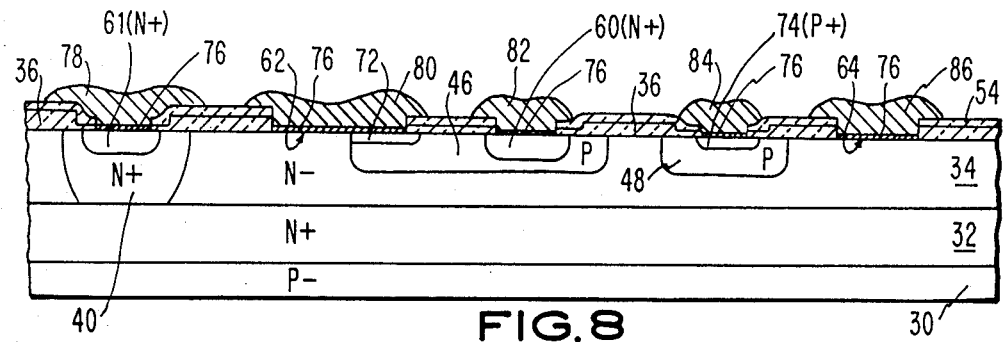

Referring to FIGS. 2–8, the present invention will be described in the context of fabricating a CTS cell consisting of a pair of Schottky barrier diodes (SBD) integrated with a vertical NPN transistor and a complementary lateral PNP transistor. In the CTS cell arrangement one SBD serves as an input device for the circuit and the second SBD, which is integrated with the base of NPN, serves to prevent saturation of the NPN device. Referring to FIG. 8 in particular, the P regions in this structure are the emitter 48 and collector 46 of LPNP (region 46 also serves as the base of NPN transistor); the N+ regions are the NPN emitter 60 and collector reach-through 40; and the N-regions are the anodes 62 and 64 of the SBD's. While the following detailed description is primarily directed to the CTS cell fabrication, this description is exemplary of the fabrication of a class of devices which embody the principles of the present invention. In addition, it should be understood that the thickness and other dimensions shown herein are selected for clarity of illustration and not to be interpreted in a limiting sense.

Figure 1:
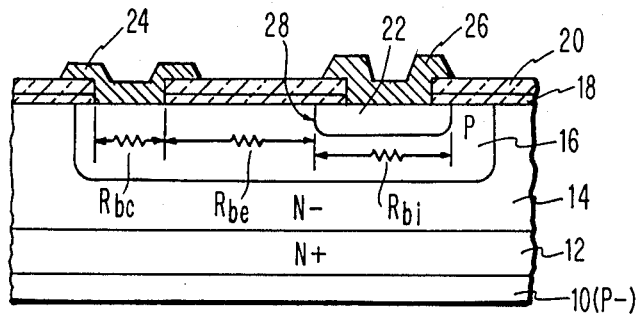
FIG. 1 is a cross-sectional view of a conventional vertical bipolar device illustrating the various base resistance components.
Figure 2:
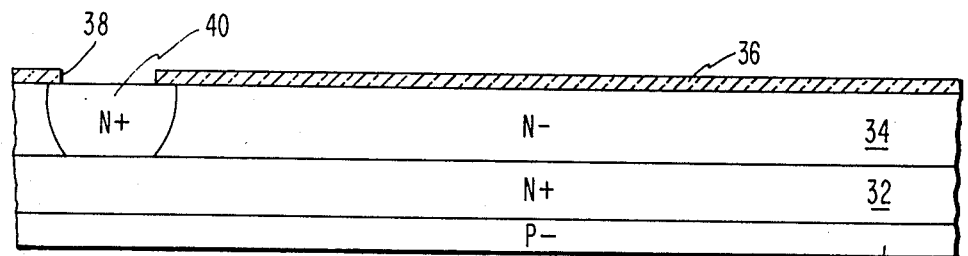
FIGS. 2–8 are flow diagrams illustrating by sequential cross-sectional representation the process steps constituting one embodiment of the invention. Specifically, these figures illustrate the present invention to fabricate a complementary transistor switch (CTS) structure.

Referring now more particularly to FIG. 2, this Fig. illustrates one small greatly enlarged portion of the silicon body which will be used to form a dense, high performance bipolar integrated (CTS) circuit. A P− substrate of monocrystalline silicon 30 has a N+ subcollector region 32 therein. An epitaxial N− layer 34 is then grown on top of the substrate 30. The substrate is typically a <100> crystallographic orientation silicon wafer having a resistance of about 10–20 ohm/cm. Subcollector diffusion is typically formed using arsenic having a surface concentration of about $1 \times 10^{20}$ atoms/cc. The epitaxial growth process to form layer 34 may be by conventional techniques well known in the art, such as the use of silicon tetrachloride/hydrogen or silane/hydrogen mixtures at temperatures of between 1000°–1200° C. During the epitaxial growth the dopant in the N+ layer moves into the epitaxial layer to fully form the subcollector region 32 as illustrated in FIG. 2. The thickness of the epitaxial layer 34 for highly dense integrated circuits is of the order of 3 μm or less and the dopant concentration therein is typically about $(1-5) \times 10^{16}$ atoms/cc.

After forming the epitaxial layer 34, the surface of this layer is oxidized at a suitable temperature to form an oxide mask 36 of typical thickness 150–300 nm. The oxide 36 also serves as a passivation layer over the active areas of the devices during the course of the fabrication. By standard lithography and etching techniques an opening 38 is formed in oxide 36 and by N type (e.g., arsenic or phosphorous) ion implantation or diffusion N+ collector reach-through region 40 (having a concentration in the range $10^{17}$–$10^{18}$ atoms/cc) is formed. The structure is then subjected to an anneal step causing the dopant in region 40 to intercept the subcollector region 32.

The next series of process steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, glass, polysilicon, etc. The preferred isolation for highly dense (VLSI or ULSI) circuits is dielectric isolation. Alternatively, in the case of polyimide-filled deep trench isolation, such isolation may be formed at a later stage after the completion of the transistor fabrication. At the completion of formation of isolation regions, an oxide layer is formed on the portion of the epitaxial layer 34 exposed by opening 38.

The process steps discussed heretofore are conventional. The distinctive features of the present process appear in the steps that follow.

Figure 3:
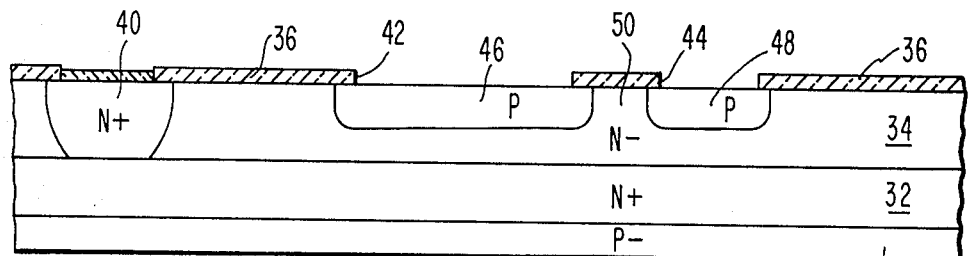

Next, referring to FIG. 3, openings 42 and 44 are made in the oxide 36 using standard lithography and etching to expose the underlying regions of the epitaxial layer 34. P type dopant (e.g., boron) is then introduced into the exposed epitaxial layer regions by ion implantation, open-tube diffusion or some other suitable doping technique forming P doped regions 46 and 48. The dopant surface concentration in the regions 46 and 48 following this doping step is typically in the range $(1-5) \times 10^{19}$ atoms/cc. The P doped region 46 serves not only as the base of the vertical NPN transistor, but also the collector of the LPNP device. The P doped region 48 serves as the LPNP emitter. The N− region 50 laterally separating the P doped regions 46 and 48 functions as the base of the LPNP device.

Figure 4:
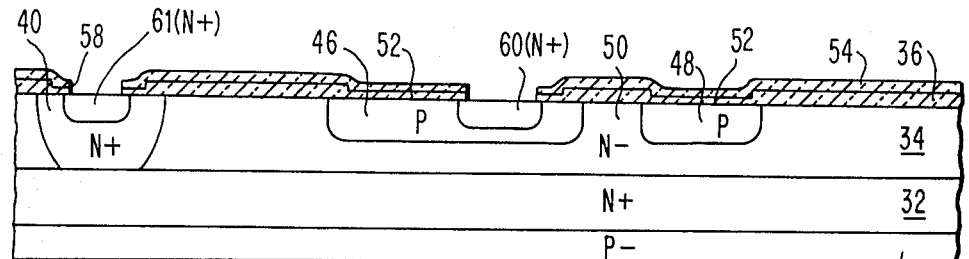

Referring to FIG. 4, after introducing the dopant into the exposed epitaxial layer regions the P doped regions are subjected to a thermal oxidation process step to drive the P diffusion into a depth of about 0.5 $\mu$m and simultaneously grow a thermal oxide layer 52 in the in the surface portion of regions 46 and 48. During this thermal oxidation step, some boron dopant from the surface portions of regions 46 and 48 will out-diffuse into the oxide layer due to the characteristically high segregation coefficient of boron. This out-diffusion will result in decreasing the P dopant concentration in the P regions 46 and 48, typically to about $(3-5) \times 10^{18}$ atoms/cc. The thickness of the oxide layer 52 is judiciously selected to be approximately one-half the thickness of the oxide layer 36. The particular thickness of the oxide 52 over the NPN base region 46 is critical to the invention since this oxide layer should be sufficiently thick to prevent excessive stress in the emitter contact due to nitrode 54 that will be formed in the next step, but also thin enough for easy removal for introduction of additional P type (boron) dopant into the P contact regions to compensate for the dopant out-diffusion discussed above.

The NPN collector-base junction depth is adjusted to give a final value of about 0.3 $\mu$m to 0.7 $\mu$m for a NPN emitter depth of about 0.1–0.5 $\mu$m used in this example. This results in an NPN base width (vertical distance between the emitter-base and collector-base junctions of the NPN device) of about 0.15–0.25 $\mu$m. These values are for illustration purposes only and can be suitably altered by one skilled in the art. The exact specification of the junction depths is dictated by the required circuit performance. However, if the NPN emitter is thinner than about 200 nm, the current gain is reduced due to heavy doping effect of the emitter. On the other hand, if the base width is too large, such as greater than 0.3 nm, the device speed is significantly reduced.

After the oxidation of the P doped regions, a thin layer of silicon nitride 54 is formed over the entire surface of the silicon body as shown in FIG. 4. The nitride layer 54 is formed by chemical vapor deposition usually under the following conditions: silane, ammonia and nitrogen gas at a temperature of about 800° C. under atmospheric or low pressure conditions.

Using conventional lithography and etching techniques the NPN emitter opening 56 and NPN collector contact opening 58 (and SBD cathode contact openings—not shown in the Figures) are made in the silicon nitride 54. Through further etching using, for example, buffered hydrofluoric acid or RIE with $CF_4$ etchant species, the portions of the oxide layer exposed by the nitride removal, in turn, is removed. The resulting structure is shown in FIG. 4.

Continuing with reference to FIG. 4, the NPN emitter 60 is now formed using arsenic capsule diffusion or ion implantation. The preferred arsenic ion implantation uses a doses of $(0.5-1) \times 10^{16}$ ions/$cm^2$ at an energy of 50–75 Kev and the anneal process conditions are about 950° C. for about 60±10 minutes to achieve an NPN emitter-base junction depth of 300–350 nm and NPN base-collector junction, after this temperature cycle, of 500–550 nm. These conditions may be varied to produce the desired transistor structure. This processing results in a base width of about 220 nm. However, NPN base widths of 100–500 nm can readily be fabricated by this process. It will be appreciated that the depth of the emitter-base junction and width of the NPN base are important to device performance. The smaller the base width and shallower the combined profile of the NPN emitter and base, the faster will be the cutoff frequency of the device. During the emitter 60 fabrication step just described, arsenic dopant is also introduced into the NPN collector reach-through region 40 (indicated by 61) and also the SBD cathode contact regions (not shown).

Figure 5:
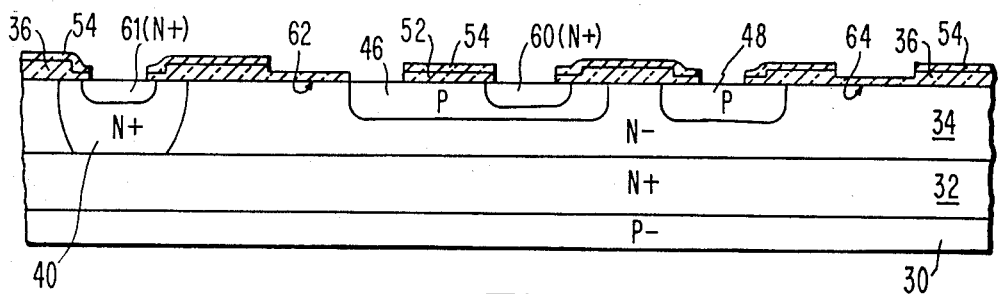

Having formed the NPN emitter 60, openings are formed by conventional lithography and etching in the nitride 54 and oxide 52 corresponding to the portions of the P doped regions 46 and 48 where electrical contacts are desired to be established. During this P contact definition process, the nitride 54 and the top surface portion of the oxide 36 overlying the anode regions 62 and 64 of the clamped SBD and the input SBD, respectively, are also removed as illustrated in FIG. 5. As shown in FIG. 5, at the completion of the forgoing P contact definition process, a remnant oxide layer 66 of thickness equal to the difference in original thickness of the oxide layers 36 and 52 will be maintained in the SBD anode regions 62 and 64. The thickness of the oxide layer 66 will typically be in the range 80–120 nm. The remnant oxide 66 in the SBD anode regions 62 and 64 will serve as an effective mask during subsequent supplementary P contact doping as will be explained hereinbelow.

Next, referring to FIG. 6, the structure is subjected to thermal oxidation using water vapor at a low temperature in the range of about 800°–900° C. Under these circumstances due to the propensity of the the N+ doped regions to oxidize at a significantly higher rate than the P doped regions, a significantly thicker oxide layer is formed in the N+ contact regions compared to that in the P contact regions. Specifically, the oxide layers 70 formed in the contact regions, respectively of the NPN emitter 60 and collector reach-through are 3–5 times thicker than the oxide layers 68 formed in the NPN base contact and LPNP emitter contact regions.

In one example, the oxide layer thickness at this stage of the fabrication process in the P doped regions (i.e., contact regions of the NPN base, LPNP emitter, LPNP collector, etc.), the N− epitaxial layer regions (corresponding to the SBD anode regions) and the N+ doped regions (i.e., contacts regions of NPN emitter or collector, LPNP base, SBD cathode, etc.) are 30 nm, 140 nm and 120 nm, respectively.

Continuing with the present process, referring to FIG. 7, the thin oxide layer 68 in the P contact regions is removed by standard dip etch using buffered hydrofluoric acid to open the P contact regions. During this etch step, a surface portion (approximately equal to the thickness of the oxide layer 68) of the oxide layers 66 and 70 will also be removed transforming them into layers 66' and 70', respectively. Typically, the thickness of the oxide that is retained in all the contact regions except the P contact regions is in the range of about 80–100 nm.

Having masked all the regions of the semiconductor body except the P contact regions with a mask composed of either an oxide (66' or 70') or an oxide-nitride (36–54 or 52–54) as illustrated in FIG. 7, P type dopant is introduced into the P contact regions to compensate for the dopant loss from these regions during the thermal oxidation step discussed previously. The P contact doping may be accomplished by low energy ion implantation or open tube diffusion. Typical ion implantation uses boron ions ($^{11}B^+$) at an energy of 5–15 Kev and dose $(1-5) \times 10^{15}$ ions/cm$^2$. A preferred method is BBr3 deposition and diffusion at a low temperature of about 800°–850° C. Diffusion is preferred since it causes minimum damage to the P doped regions. Low temperature is preferred since redistribution of NPN base and emitter dopant profiles will be minimized. The P contact diffusion is driven typically to a depth of 0.1–0.3 $\mu$m establishing P+ pockets 72 and 74. The boron doping in this step is accomplished to achieve a boron concentration equal to solid solubility limit of boron in silicon or at least $10^{20}$ atoms/cc. During this P contact doping step, since all of the regions except the P contact regions are masked, the P+ pockets 72 and 74 are formed in self-aligned relationship with the underlying P doped region.

The above P contact doping results in several benefits: it replenishes the dopant loss due to out-diffusion in prior thermal process steps thereby dramatically reducing the contact resistance associated with the P doped regions, particularly, the NPN base contact resistance Rbc; it reduces extrinsic base resistance Rbe of the NPN due to the increased doping concentration in the proximity of the base contact; the net effect of these reductions in base resistance components is a significant reduction in the NPN base series resistance; it reduces the series resistance of the LPNP emitter thereby increasing the efficiency of this emitter and the gain of the LPNP transistor; the dopant concentration profile of the NPN emitter and therefore its efficiency is preserved since the NPN emitter is fully masked during the P contact doping step and prevented from any counter doping; increased doping of the NPN base contact also increases the inverse gain of the NPN device which is a desirable feature in merge transistor logic (MTL) circuit designs. In fact, an experimental comparison of identical CTS structures fabricated in accordance with the present process and the prior art process which does not have controlled introduction of dopant into the base contact following emitter fabrication indicated the following dramatic improvements: the extrinsic base resistance was 40% lower, the LPNP gain (at 100 $\mu$ amps) was 45% higher and NPN inverse gain (at 100 $\mu$ amps) was about 30% higher than those for the CTS structure fabricated using the prior art process.

Next, continuing with reference to FIG. 7, the oxide layers 70' in the N+ regions is removed by means of a suitable etchant thereby exposing the N+ contact regions. At this stage all the contact areas of the integrated circuit device are open and ready for formation of ohmic contacts. A variety of metal ohmic contacts may be utilized for this structure. However, there is shown as an example a platinum silicide ohmic contact 76 for each of the elements of the CTS cell. This is formed by blanket depositing platinum metal over the bare silicon as well as the silicon nitride surfaces. The structure is heated to a low temperature in the range approximately 400°–550° C. to form platinum silicide by reacting the silicon and platinum. The unreacted metal is now removed by conventional etching. The platinum silicide formed in regions 62 and 64 will function as the P side (i.e., the anode) of the two SBD junctions. A blanket metal layer of transition metal, aluminum, aluminum-copper or the like is deposited over the platinum silicide and silicon nitride layer. Conventional lithography and etching techniques are used to delineate the blanket metal layer to form the NPN collector contact 78, the common contact 80 of the clamped SBD anode and NPN base (also LPNP collector), PNP emitter contact 82, LPNP emitter contact 84 and input SBD anode contact 86.

In summary, reduction in P contact resistance is achieved using the invention by performing a solid solubility diffusion with no subsequent reoxidation of the base contact region which would deplete the contact surface region. This is accomplished by (1) taking advantage of the phenomenon that heavily doped N+ regions oxidize at a substantially higher rate than P doped regions at low temperatures to interpose in the N+ contact areas an oxide mask which would prevent counter-doping of these N+ regions during the P counter-doping of these N+ regions during the P contact region doping step; and (2) judiciously choosing the original oxide layer thicknesses in the various N−, N+ and P regions to permit selective masking/opening of these regions during the various doping steps. The final supplementary doping is self-aligned to the P contact regions (meaning that the final P contact diffusion is provided only in the P contacts) without either warranting additional masks or increasing the spacing between the contacts. In other words, the present process provides a superior (extremely low circuit delay) integrated device/circuit structure with tighter contact spacing (enhancing the device density).

Thus, there has been provided in accordance with the invention a process that fully satisfies the objects and advantages set forth.

While the invention has been described in the context of forming a CTS cell composed of bipolar devices, it is evident that many alternatives, modifications and variations will be apparent to those skilled in the art in light of the foregoing description. In its broadest form, the invention can be applied to reduce P contact resistance in any integrated circuit regardless of whether it is bipolar or FET technology so long as there exist both N and P type regions in the circuit and low resistance contacts are required therefor. While the invention has been described in the context of fabricating active devices, it is equally applicable to fabrication of passive devices or a circuit involving a combination of both active and passive devices. Passive devices in this connection include resistors and capacitors. It is therefore contemplated that the appended claims will embrace any such alternatives, modifications and variations as fall within the scope and spirit of the invention.

What is claimed is:

1. A method for forming low resistance ohmic contacts to doped regions in a semiconductor substrate comprising:

providing a semiconductor substrate having at least one region of a first conductivity type and a second region of a second conductivity type on a surface thereof;

forming an insulator layer on said substrate surface;

forming contact openings in said insulator corresponding to said first and second conductivity type regions;

forming an insulator in said openings, by thermal oxidation the insulator in said opening corresponding to said second conductivity type region being 3-5 times thicker than that in said opening corresponding to said first conductivity type region;

removing said insulator in said opening corresponding to said first conductivity type region while maintaining substantially said insulator in said opening corresponding to said second conductivity type region;

introducing first conductivity type dopant into said first conductivity type region through said corresponding contact opening to reduce contact resistance;

removing said insulator in said contact opening to said second conductivity type region; and forming ohmic contacts to said first and second conductivity type regions via said respective contact openings.

2. The method as recited in claim 1 wherein said first conductivity type is P type.

3. The method as recited in claim 2 wherein said semiconductor is silicon.

4. The method as recited in claim 3 wherein said P type dopant is boron and said doping to reduce contact resistance of said P region is accomplished to achieve approximately the solid solubility limit of boron in silicon.

5. The process as recited in claim 3 wherein said insulator in said contact openings is silicon dioxide.

6. The process as recited in claim 3 wherein said insulator layer on said substrate is composed of silicon dioxide and silicon nitride.

7. The process as recited in claim 6 wherein said silicon dioxide is formed by thermally oxidizing said openings at a low temperature of 800°–900° C. and taking advantage of the differential oxidation rate of said P and N type regions exposed by said contact openings.

8. A process for forming self-aligned low resistance ohmic contacts to doped regions in a semiconductor substrate, said process comprising:

providing a semiconductor substrate having at least a P type region in the surface thereof and covered with an insulator layer;

forming a highly doped N (hereafter N+) type region in a surface portion of said substrate by forming a small opening in said insulator layer and introducing N type dopant into said substrate surface exposed by said opening;

forming a contact opening in said insulator layer corresponding to said P type region;

thermally oxidizing the resulting structure at a low temperature to form an oxide layer which is substantially thicker in said opening corresponding to said N+ region than in said contact opening corresponding to said P type region by utilizing the differential oxidation rate of said P and N+ type regions;

removing the oxide layer in said P contact opening while leaving in tact a sufficiently thick oxide in said opening corresponding to the N+ type region;

introducing P type dopant into the P type region exposed by said P contact opening; and forming ohmic contacts with said P and N+ type regions via said corresponding openings.

9. The process as in claim 8 wherein said N+ region is formed in a surface portion of said P type region.

10. The process as in claim 9 wherein said semiconductor is monocrystalline silicon.

11. The process as in claim 10 wherein said P type and N+ regions are the base and emitter of a vertical NPN transistor, said base being formed by boron doping and said emitter by arsenic doping.

12. The process as in claim 11 wherein the thickness of the oxide in the emitter contact region is about 3–5 times thicker than that in the base contact opening.

13. The process as in claim 12 wherein the surface concentration of said base contact doping is as high as the solid solubility limit of boron in silicon.

14. The process as in claim 13 wherein said low temperature is in the range of about 800°–900° C.

15. A method of forming a semiconductor device on a silicon substrate surface, comprising:

forming a P type base region on a portion of said substrate surface and an insulator layer covering said substrate surface;

forming a first opening in said insulator layer exposing a portion of the base region;

forming an N type high dopant concentration emitter in a surface portion of said base region by introducing dopant into said exposed portion of the base region;

forming a second opening in said insulator layer to expose a second portion of said base region where base contact is desired;

thermally oxidizing at a low temperature to form oxide layers over said emitter and base portion exposed by said second opening, the oxide over said emitter being substantially thicker than that over said base contact due to the differential oxidation rate of said emitter and base contact regions;

removing said oxide over said base contact region while maintaining a substantial thickness of said oxide over said emitter;

introducing P type dopant into said base contact region to reduce contact resistance of said base;

removing said substantial thickness of oxide over said emitter; and establishing ohmic contacts with said base contact region and emitter region.

16. The process as in claim 15 wherein said base is P type and said emitter is N type.

17. The process as in claim 16 wherein the dopant concentration of said emitter is in the range $0.5 \times 10^{20}$ atoms/cc to $3 \times 10^{20}$ atoms/cc.

18. The process as in claim 17 wherein the dopant concentration of said base region is in the range $(2-6) \times 10^{18}$ atoms/cc.

19. The process as in claim 18 wherein the dopant concentration in the base contact after introducing said dopant into said base contact is in the range of $(0.5-1) \times 10^{20}$ atoms/cc.

20. The process as in claim 19 wherein said insulator layer is composed of silicon dioxide and silicon nitride.

* * * * *